(12) United States Patent
Sanese (10) Patent No.: US 9,391,473 B2
(45) Date of Patent: Jul. 12, 2016

(54) SOLAR COLLECTION ASSEMBLY, SYSTEM, AND METHOD

(71) Applicant: ASM IP Holdings, LLC, Columbus, OH (US)

(72) Inventor: Christopher N. Sanese, Columbus, OH (US)

(73) Assignee: ASM IP Holdings LLC, Columbus, OH (US)

( * ) Notice: Subject to any disclaimer, the term of this patent is extended or adjusted under 35 U.S.C. 154(b) by 151 days.

(21) Appl. No.: 14/535,350

(22) Filed: Nov. 7, 2014

(65) Prior Publication Data
US 2015/0130398 A1    May 14, 2015

Related U.S. Application Data

(60) Provisional application No. 61/902,837, filed on Nov. 12, 2013.

(51) Int. Cl.
| | |
|---|---|
| *H02J 7/00* | (2006.01) |
| *H01M 10/44* | (2006.01) |
| *H01M 10/46* | (2006.01) |
| *H02J 7/35* | (2006.01) |
| *H01L 31/054* | (2014.01) |
| *H01L 31/05* | (2014.01) |
| *H02S 40/42* | (2014.01) |
| *H02S 10/12* | (2014.01) |

(52) U.S. Cl.
CPC ............... *H02J 7/35* (2013.01); *H01L 31/0508* (2013.01); *H01L 31/0547* (2014.12); *H02S 10/12* (2014.12); *H02S 40/425* (2014.12); *Y02E 10/52* (2013.01)

(58) Field of Classification Search
CPC ... H02J 7/35; H01L 31/0547; H01L 31/0508; H02S 20/10; H02S 30/10; H02S 40/42; Y02E 10/52; Y02E 10/42
See application file for complete search history.

(56) References Cited

U.S. PATENT DOCUMENTS

| | | | | |
|---|---|---|---|---|
| 2008/0216822 | A1* | 9/2008 | Lazzara | F01K 3/00 126/617 |
| 2011/0197968 | A1* | 8/2011 | Montgomery | F24J 2/062 136/259 |
| 2012/0031467 | A1* | 2/2012 | Schmaelzle | F24J 2/065 136/247 |

\* cited by examiner

*Primary Examiner* — Vuthe Siek
(74) *Attorney, Agent, or Firm* — Mueller Law, LLC; Jerry K. Mueller, Jr.

(57) ABSTRACT

Disclosed is a solar collection assembly for collection of incident solar energy and generation of electricity. Such assembly includes a central vertically oriented support column. A solar collection assembly includes a plurality of dual faced solar receptor assemblies, each solar receptor assembly having an upper solar receptor surface and a lower solar receptor surface. The central vertically oriented support column carries each solar collection assembly. A solar collector reflective assembly surrounds the central vertically oriented support column and is oriented to reflect incident solar energy onto the solar collection assembly.

20 Claims, 6 Drawing Sheets

SOLAR COLLECTION ASSEMBLY, SYSTEM, AND METHOD

CROSS-REFERENCE TO RELATED APPLICATIONS

This application claims benefit of provisional application Ser. No. 61/902,837 filed on Nov. 12, 2013.

STATEMENT REGARDING FEDERALLY SPONSORED RESEARCH

Not applicable.

BACKGROUND

The present disclosure relates to solar collectors and more particularly to an improved solar collection system.

The amount of energy from the sun that falls on Earth's surface is enormous. All the energy stored in Earth's reserves of coal, oil, and natural gas is matched by the energy from just 20 days of sunshine. Outside Earth's atmosphere, the sun's energy contains about 1,300 watts per square meter. About one-third of this light is reflected back into space, and the atmosphere absorbs some (in part causing winds to blow). By the time it reaches Earth's surface, the energy in sunlight has fallen to about 1,000 watts per square meter at noon on a cloudless day. Averaged over the entire surface of the planet, 24 hours per day for a year, each square meter collects the approximate energy equivalent of almost a barrel of oil each year, or 4.2 kilowatt-hours of energy every day. Deserts, with very dry air and little cloud cover, receive the most sun—more than six kilowatt-hours per day per square meter. Northern climates, such as Boston, get closer to 3.6 kilowatt-hours. Sunlight varies by season as well, with some areas receiving very little sunshine in the winter. Seattle in December, for example, gets only about 0.7 kilowatt-hours per day.

It also should be noted that these figures represent the maximum available solar energy that can be captured and used, but solar collectors capture only a portion of this, depending on their efficiency. For example, a one square meter solar electric panel with an efficiency of 15 percent would produce about one kilowatt-hour of electricity per day in Arizona. Solar collectors are limited by their collection are; thus, making large fields of them necessary for achieving truly commercial scale electrical generation.

The present disclosure addresses this limitation and more.

BRIEF SUMMARY

Disclosed is a solar collection assembly for collection of incident solar energy and generation of electricity. Such assembly includes a central vertically oriented support column. A solar collection assembly includes a plurality of dual faced solar receptor assemblies, each solar receptor assembly having an upper solar receptor surface and a lower solar receptor surface. The central vertically oriented support column carries each solar collection assembly. A solar collector reflective assembly surrounds the central vertically oriented support column and is oriented to reflect incident solar energy onto the solar collection assembly.

BRIEF DESCRIPTION OF THE DRAWINGS

For a fuller understanding of the nature and advantages of the present method and process, reference should be had to the following detailed description taken in connection with the accompanying drawings, in which.

The drawings will be described in greater detail below.

DETAILED DESCRIPTION

A feature of the disclosed solar collector assemblies resides in the multi-faceted solar receptors that accept solar energy both on their top surfaces and their lower surfaces; thus, increasing the area upon which solar energy strikes without consuming additional acreage. This is possible by orienting the multi-faceted solar receptors with respect to a parabolic or other designed surface that also reflects the incident solar energy to the lower surfaces of the dual faced solar receptors. Solar energy, then, strikes both the upper surface and the lower surface of the multi-faceted solar receptor assemblies. The uniqueness in design of the disclosed solar module resides additionally in its ability to add wind turbine generation to the solar module with collection of water for additional use.

The basic components of the solar module are as follows:
A. vertical support column clad with solar receptors, optionally with turbine generation (aka aero, for present purposes);
B. multi-faceted solar receptor assemblies;
C. parabolic solar reflective component;
D. support base with optional water filtration reservoir;
E. optional mesh portal for use with water filtration reservoir;
F. system display; and
G. circuitry, and battery and/or inverter components.

Figure 1:
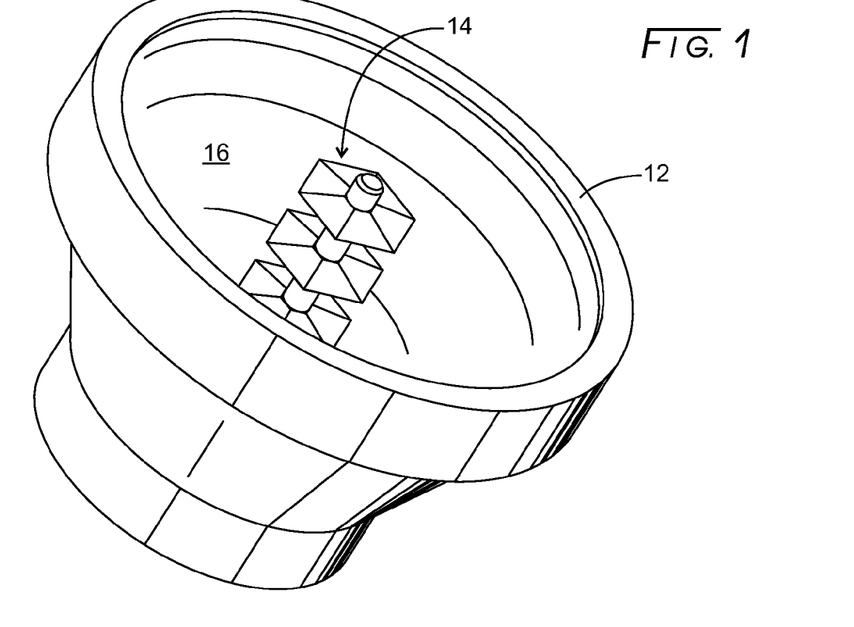
FIG. 1 is an isometric view of a parabolic solar collector assembly.
Figure 2:
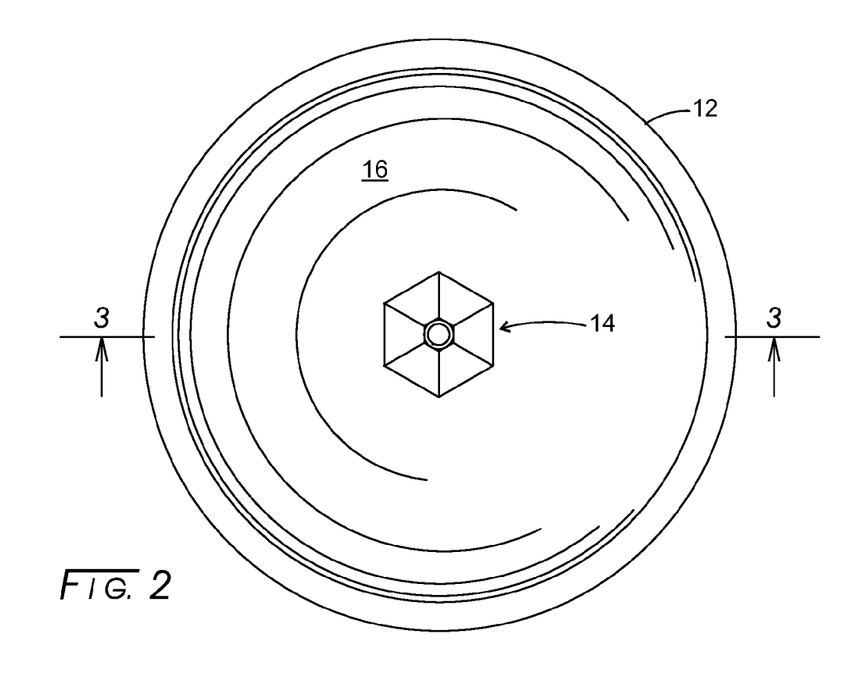
FIG. 2 is a top view of the parabolic solar collector assembly of FIG. 1.
Figure 3:
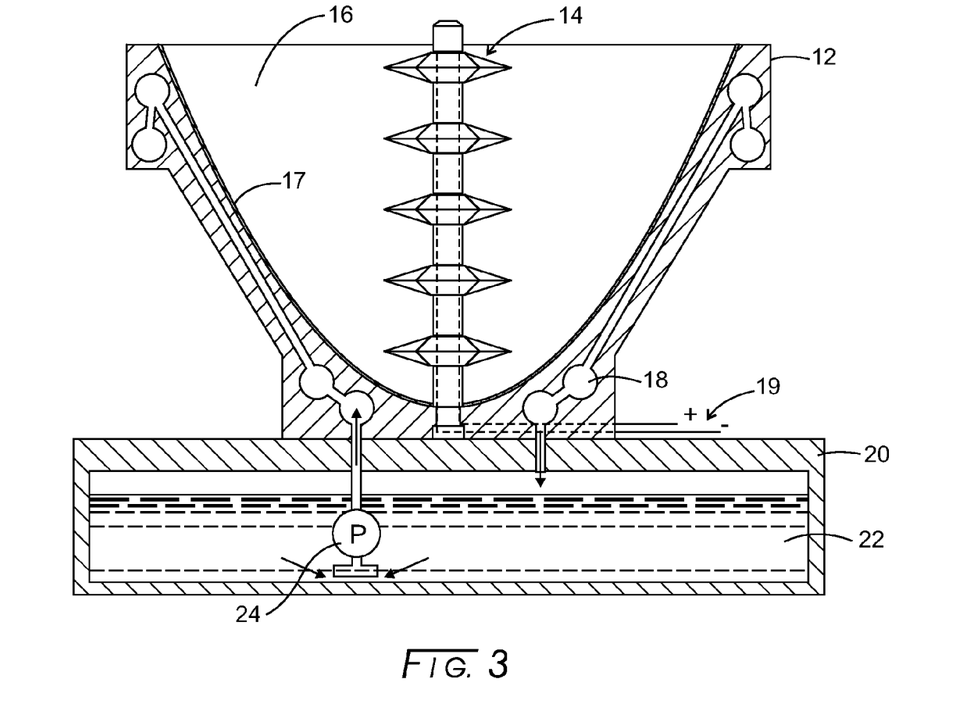
FIG. 3 is a cross-sectional view taken along line 3-3 of FIG. 1.

Referring now to FIGS. 1, 2 and 3, a prototype solar module is illustrated. The basic components of the illustrated prototype are a solar collector assembly, 12, and a solar receptor tower, 14. The design of solar collector assembly 12 is one of choice so long as its inner surface, 16, is parabolic in shape to maximize solar reflection onto solar receptor tower 14; although alternative curvilinear, segmented, and other geometric shapes likely will find use in constructing the solar module disclosed herein. Depending upon the orientation and design of solar receptor tower 14, the number of towers, and their orientation, different shaped inner surfaces may be appropriate for solar collector assembly 12. Materials of construction for solar collector assembly 12 will be appropriate for durability, resistance to weathering, and like factors, bearing in mind that solar collector assembly 12 also provides support for solar receptor tower 14. Appropriate materials, then, include, for example, metals, ceramics, glasses, plastics, combinations thereof, and the like, optionally laminated and optionally with special finishes. Regardless of material of construction, solar collector assembly 12 has a specular interior surface. In fact, the solar collector assembly even may be inflatable.

The interior surface of solar collector assembly 12 will be specular so as to reflect solar radiation incident thereupon. Solar collector assembly 12 can be inherently specular, such as, for example, by being made from metal, such as aluminum, or can have a specular coating, 17, applied to it. Such mirrored coating 17 can be a single surface or it can be made from several sections or panels. Such sections or panels can be horizontal or vertical in orientation and held in place by hardware (e.g., nuts and bolts), can rest on ledges formed on the interior surface of solar collector assembly 12, or otherwise formed in multiple sections. Such sections even can be linear rather than curved so as to approximate a parabolic or other curvilinear shape and find acceptable use for present purposes.

With a specular lining, the structure supporting the specular lining can be made from a variety of durable materials, such as, for example, concrete, wood, metal, plastic, ceramic, combinations, and the like. Use of a specular lining may make maintenance and replacement of the specular lining, especially when formed from panels, easier and more cost effective. Of course, remote monitoring of the solar collector assembly or more likely an array of solar collector assemblies may find advantage.

Since solar collector assembly 12 will be located in the sun and its interior surface will be specular or made from material providing a specular surface, it is reasonable that solar collector assembly 12 will become hot. Thus, FIG. 3 reveals a fluid conduit, 18, formed in the interior of the walls forming solar reflective collector assembly 12. Water or other fluid can be pumped through fluid conduit 18 and the heat value collected for use. While solar collector reflective assembly 12 can be designed to be self-supporting, such as is illustrated, mounting solar collector assembly 12 atop a base, 20, has the added value of providing a reservoir for the water or other fluid, 22, flowing through fluid conduit 18 and for housing a pump, 24, for pumping fluid through fluid conduit 18. Fluid in conduit 18 also will provide cooling to solar collector reflective assembly 12.

Electrical leads, 19, can be seen exiting solar collector reflective assembly 12 at its connection with base 20. Further description on the electrical circuitry and connections will be set forth below.

Figure 4:
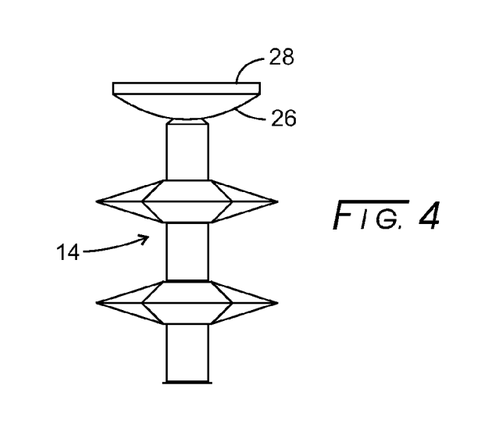
FIG. 4 is a side view of a cap assembly for the collector tower, which is part of the parabolic solar collector assembly of FIG. 1.
Figure 5:
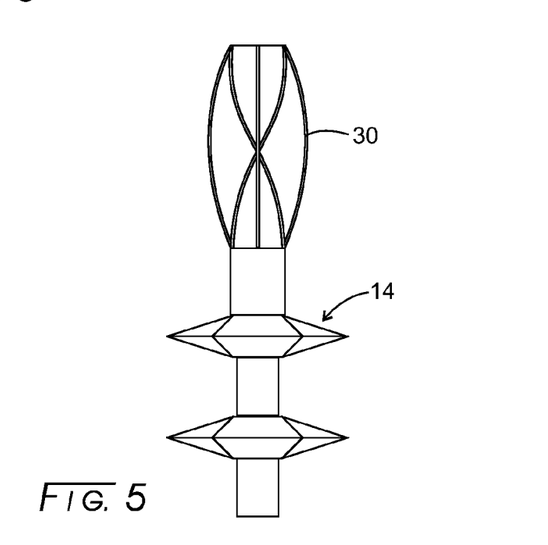
FIG. 5 is a side view of an alternative cap assembly for the collector tower, which is part of the parabolic solar collector assembly of FIG. 1.

FIGS. 4 and 5 show two different cap assemblies for solar receptor tower 14, with no cap shown in FIG. 1. Use of a cap is entirely optional. In FIG. 4, a cap, 26, has a solar receptor, 28, mounted on its top for generating additional solar electricity. In FIG. 5, a vertical wind generator, 30, is mounted atop solar receptor tower 14, again for generating additional electricity. A variety of different cap assemblies can be envisioned for tower 14, either active in generating additional electricity or passive, or no cap as stated above.

Figures 6, 7, 8:
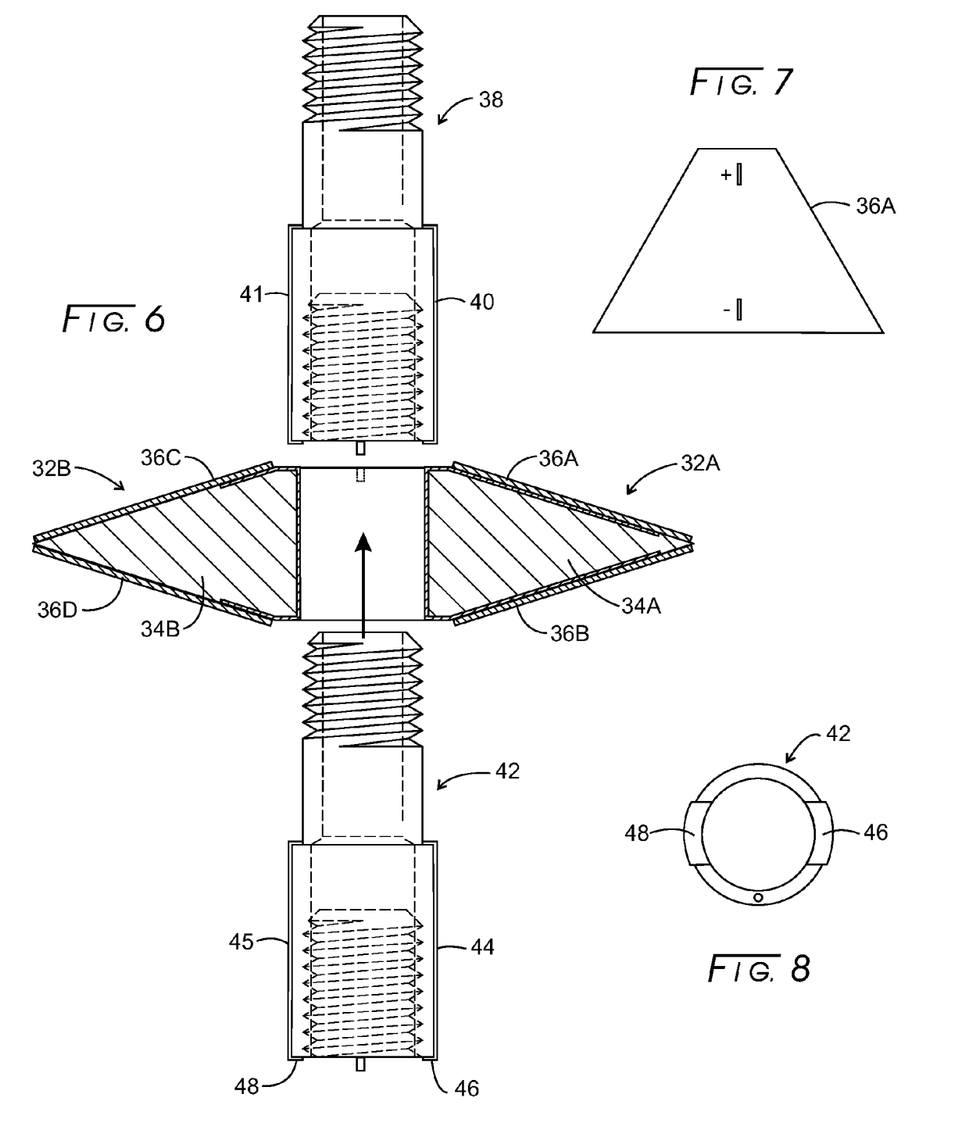
FIG. 6 is a partial exploded cross-sectional view of one of the frustum solar receptors of the collector tower and supporting standoff solar receptors.
FIG. 7 is the backside of a frustum shaped solar receptor showing positive (+) and negative (−) pad connectors.
FIG. 8 is a bottom view of the standoff showing the alignment apertures and the + and − connector pads.

In FIG. 6, a partial exploded cross-sectional view of one of the solar receptor assemblies of solar receptor tower 14 is illustrated. It will be appreciated that the solar receptor assemblies may not entirely surround tower 14. In FIG. 6, there are 6 such solar receptor assemblies with receptors 32A and 32B shown in this figure. The number and location of such solar receptor assemblies can be greater or lesser than the number illustrated in the drawings. Each receptor assembly is composed of an inner support, 34A and 34B, respectively, each of which has a trapezoidal-shaped top surface and bottom surface. The top and bottom surfaces of inner supports 34A and 34B are clad with a solar receptor, 36A and 36B for assembly 32A; and 36C and 36D for assembly 32B. Accordingly, each solar receptor may be trapezoidal, circular, or other shape, with the prototype in the drawings being trapezoidal, wedge-shaped as is seen in FIG. 7, which also shows the + and − electrical connections located on the underneath side of solar receptor 36A. Similar such electrical connections will be provided for each solar receptor mounted on tower 14.

Each solar receptor assembly is interconnected by standoff assemblies, such as is illustrated in FIG. 6. In particular, solar receptor assembly 32 has a central aperture penetrating therethrough. An upper standoff, 38, has an upper male threaded end and a lower female threaded end. The lower end of standoff 38 is clad with solar receptors as at solar receptors, 40 and 41, and receives the upper male threaded end of another standoff, 42, also solar receptor clad as at solar receptors, 44 and 45. The upper male threaded end of standoff 42 fits through the central aperture in solar receptor assembly 32 and is screwed into the lower female threaded end of standoff 38. In FIG. 8, + and − electrical connection pads, 46 and 48, are illustrated for standoff 42 for transmitting the generated electricity from each solar receptor assembly to a collection point. It will be appreciated that a variety of different assemblies could be provided for forming tower 14 and for carrying the solar receptor assemblies.

Figure 9:
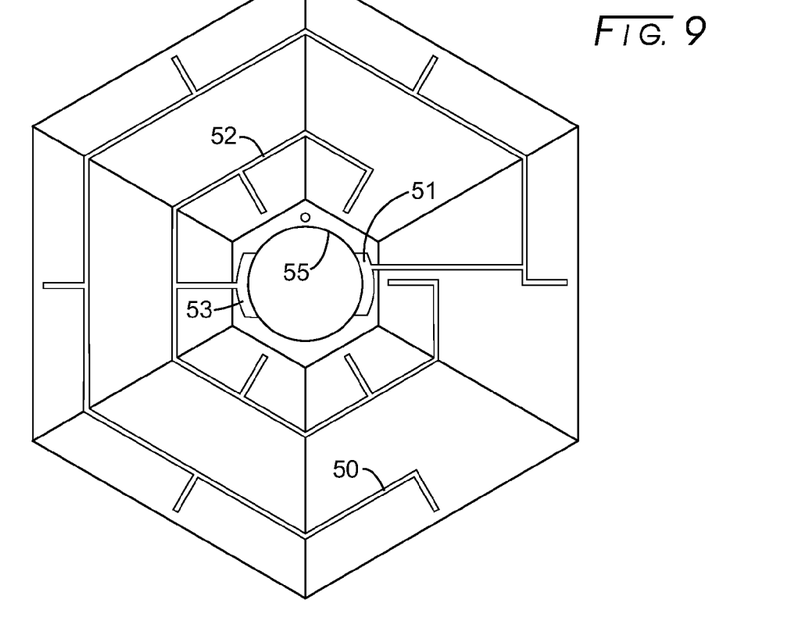
FIG. 9 is a top view of the solar receptor clad frustum showing a parallel surface circuit.
Figure 10:
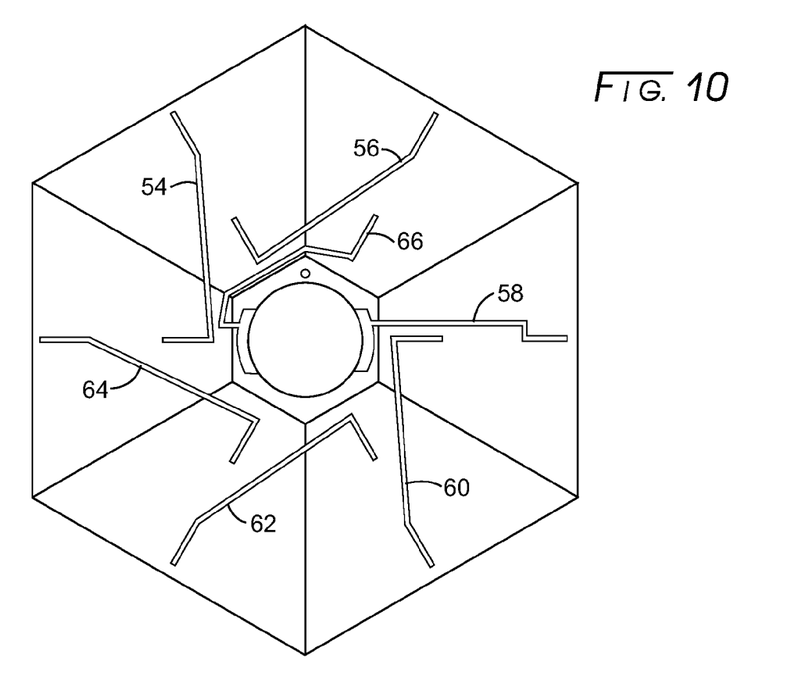
FIG. 10 is a top view of the solar receptor clad frustum showing a series surface circuit.

FIG. 9 is a top view of the solar receptor clad frustum showing parallel surface circuits, 50 and 52, for the 6 hexagonal solar receptor assemblies illustrated. Each circuit 50 and 52 is connected to electrical connection pads, 51 and 53, mounted to a standoff, 55. FIG. 10 is a top view of the solar receptor clad frustum showing series surface circuits, 54-66, again for the 6 solar receptor assemblies illustrated. Each circuit again is in electrical connection to electrical connection pads carried by a standoff, such as is described earlier herein. Advantages and disadvantages to each circuit are well known to the skilled artisan and are a matter of choice to the designer. For example, on each face of the frustum, the solar cells could be connected in series as illustrated in FIG. 10, each face forming a string. The strings, then, could be connected in parallel. Depending on the size of the solar unit, there could be multiple strings on a face. Thus, the designer of the solar assemblies has a variety of choices with respect to the electrical circuits, which is an additional advantage of the disclosed solar assemblies.

Figure 11:
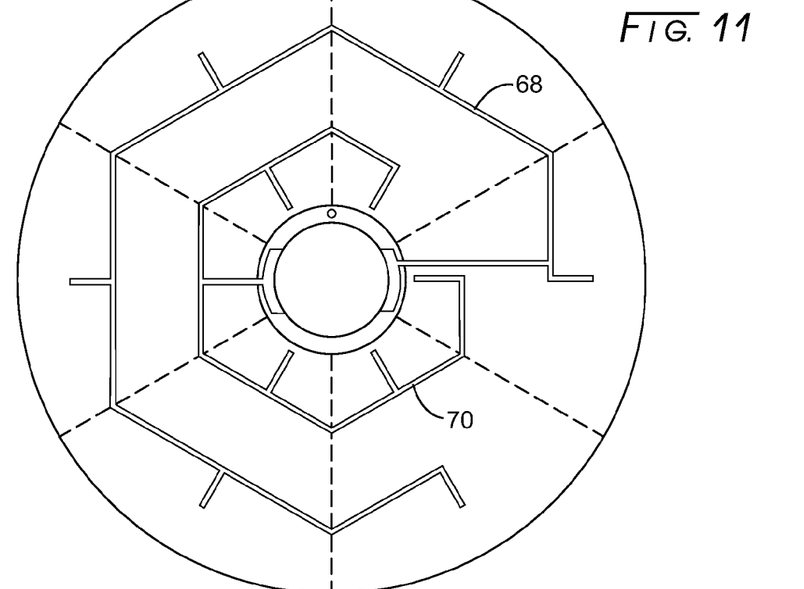
FIG. 11 is a top view of a conical frustum with a parallel surface circuit where the solar receptors bend to the shape of the conical frustum surface.

FIG. 11 is a top view of a conical frustum with parallel surface circuits, 68 and 70, where the solar receptors bend to the shape of the conical frustum surface. Each circuit again is in electrical connection to electrical connection pads carried by a standoff, such as is described earlier herein.

Figure 12:
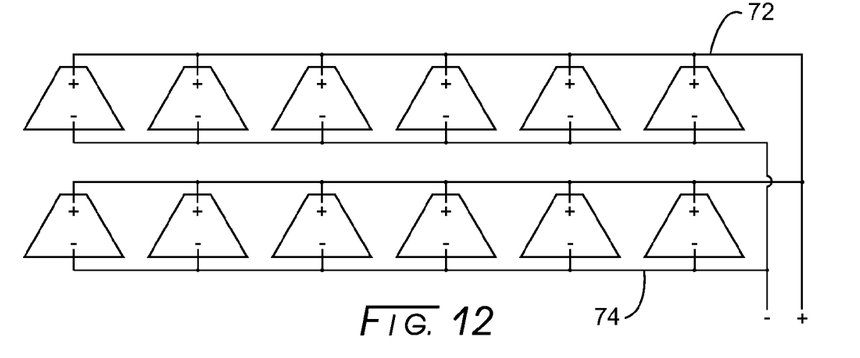
FIG. 12 is a parallel wiring diagram of the frustum surface circuits, both top and bottom.
Figure 13:
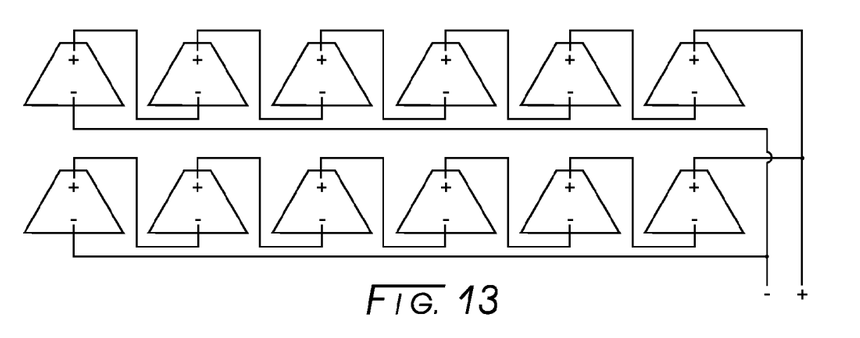
FIG. 13 is a series wiring diagram of the frustum surface circuits, both top and bottom.

FIG. 12 is a parallel wiring diagram of the frustum surface circuits, both top and bottom, for a plurality of receptor assemblies. All electrical positive sides are parallelly connected by a line, 72, as are all electrical negative sides by a line, 74. FIG. 13 is a series wiring diagram of the frustum surface circuits, both top and bottom, for a plurality of receptor assemblies. In this case, each adjacent electrical positive pole is connected to an adjacent solar receptor at its negative pole.

Figures 14, 15, 16:
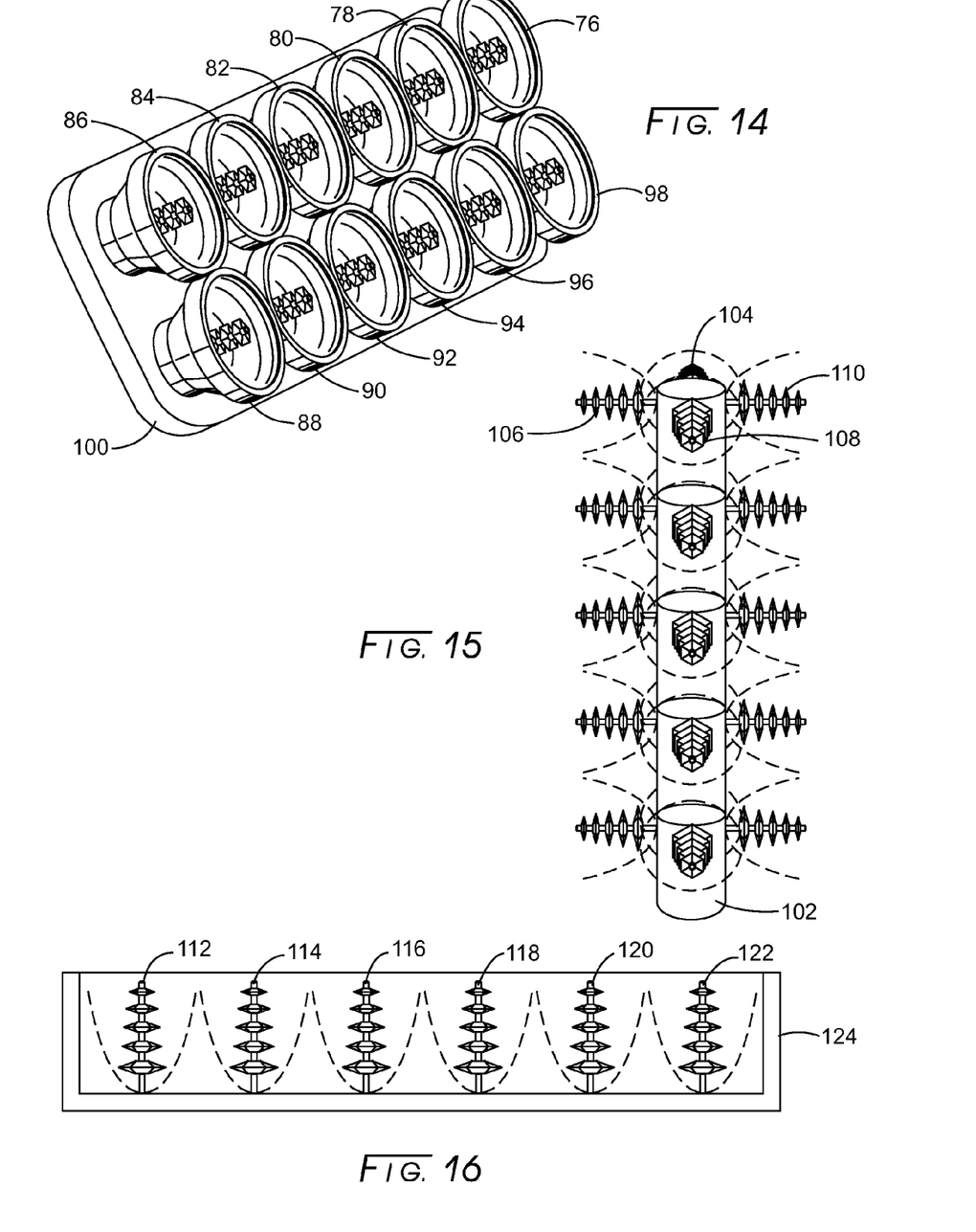
FIG. 14 is an isometric view of an array of parabolic solar collector modules mounted to a common base.
FIG. 15 is an isometric view of a solar tower array where a central column supports a plurality of horizontal parabolic solar collector assemblies.
FIG. 16 is a side view of a plurality of vertical parabolic solar collector assemblies housed within a housing.

FIG. 14 is an isometric view of an array of parabolic solar collector modules, 76-98, mounted to a common base, 100. FIG. 15 is an isometric view of a solar tower array where a central column, 102, supports a plurality of horizontally oriented parabolic solar collector assemblies, as illustrated by representative solar receptor towers, 104-110. Such solar tower array can be mounted to a base, such as is described earlier herein. FIG. 16 is a side view of a plurality of vertical solar collector assemblies, 112-122, housed within a central housing, 124. The number of such solar collector assemblies is limited only by the size of housing 124, again lending flexibility to the designer of such array.

Of importance in having an upper solar receptive surface and a lower solar receptive surface, is the mounting of the dual faced solar receptors in harmony with a parabolic or other designed mirror or specular surface so that solar energy can strike the upper solar receptive surface directly and the mirror will cause the incident solar energy to strike the lower solar receptive surface of the dual faced solar receptors. As mentioned, a variety of curvilinear mirrored surfaces, flat mirrored surfaces, or combination curvilinear/flat mirrored surfaces can be used in accordance with the precepts of the disclosed solar cells. It is possible to have an upper hemispherical surface that is half-mirrored so as to permit passage of direct incident solar energy from the outside, while providing an additional inner reflective surface to increase the amount of solar energy striking the dual faced solar receptors.

The central column can be covered with additional solar receptors if desired. The upper end of the central column also can be rotatable and connected to a drive shaft disposed within the central column. Such rotatable upper end can be driven by air currents to generate additional electricity and increase the total amount of electricity that the disclosed solar module can generate.

Since some configurations of the disclosed solar module will have the parabolic mirror exposed to rain, provision can be made around the juncture of the central column and the mirror to place a mesh for filtering and permitting rain to flow therethrough and into a base reservoir for its collection and reuse. Of course, the disclosed solar module will have a readout display for maintenance and collection of data. Provision of an inverter, battery, and other components for collection of the generated electricity will be provided as needed.

While the device and method have been described with reference to various embodiments, those skilled in the art will understand that various changes may be made and equivalents may be substituted for elements thereof without departing from the scope and essence of the disclosure. In addition, many modifications may be made to adapt a particular situation or material to the teachings of the disclosure without departing from the essential scope thereof. Therefore, it is intended that the disclosure not be limited to the particular embodiments disclosed, but that the disclosure will include all embodiments falling within the scope of the appended claims. In this application all units are in the metric system and all amounts and percentages are by weight, unless otherwise expressly indicated. Also, all citations referred herein are expressly incorporated herein by reference.

I claim:

1. A solar collection assembly for collection of incident solar energy and generation of electricity, which comprises:
   (a) a central vertically oriented support column;
   (b) a solar collection assembly comprising one or more dual faced solar receptor assemblies, each solar receptor assembly having an upper solar receptor surface and a lower solar receptor surface, said solar collection assembly carried by said central vertically oriented support column; and
   (c) a solar collector reflective assembly surrounding said central vertically oriented support column and oriented to reflect incident solar energy onto said solar collection assembly.

2. The solar module collection assembly of claim 1, wherein each solar receptor assembly comprises a wedge-shaped support having an upper surface and a lower surface, each upper and lower surface having a solar receptor affixed thereto.

3. The solar module collection assembly of claim 1, wherein said central vertically oriented support column has solar receptors affixed thereto.

4. The solar module collection assembly of claim 1, wherein each solar receptor is in series, parallel, or a combination electrical connection.

5. The solar module collection assembly of claim 1, wherein said solar receptors are in electrical connection with a battery, inverter, or combination thereof.

6. The solar module collection assembly of claim 1, wherein said solar collector reflective assembly has fluid conduit formed therein.

7. The solar module collection assembly of claim 6, which is mounted to a base having a reservoir for fluid in communication with said solar collector reflective assembly fluid conduit.

8. The solar module collection assembly of claim 1, wherein said central vertically oriented support column is capped at its top with a solar reflective surface or a wind turbine.

9. An array of solar module collection assemblies of claim 1.

10. The array of claim 9, which is housed within a central housing.

11. A vertically oriented central column carrying a plurality of horizontally mounted solar modules of claim 1, said central column located in a solar collector reflective assembly surrounding oriented to reflect incident solar energy thereonto.

12. A method for generating electricity from a solar collection assembly, which comprises the steps of:
   (A) providing a solar module collection assembly comprising:
      (a) a central vertically oriented support column;
      (b) a solar collection assembly comprising one or more dual faced solar receptor assemblies, each solar receptor assembly having an upper solar receptor surface and a lower solar receptor surface, said solar collection assembly carried by said central vertically oriented support column; and
      (c) a solar collector reflective assembly surrounding said central vertically oriented support column and oriented to reflect incident solar energy onto said solar collection assembly.
   (B) exposing said provided solar module collection assembly to solar energy; and
   (C) one or more of storing or using the solar energy generated thereby.

13. The method of claim 12, wherein each solar receptor assembly is formed from a wedge-shaped support having an upper surface and a lower surface, and affixing a solar receptor to each said upper and lower surface.

14. The method of claim 12, further including the step of affixing solar receptors to said central vertically oriented support column.

15. The method of claim 12, further including the step of electrically connecting each solar receptor in one or more of series, parallel, or a combination.

16. The solar module collection assembly of claim 12, further including the step of electrically connecting said solar receptors with one or more of a battery, inverter, or combination thereof.

17. The solar module collection assembly of claim 12, further including the step of providing a fluid conduit in said solar collector reflective assembly.

18. The solar module collection assembly of claim 17, further including the step of mounting providing a base having a reservoir and connecting said solar collector reflective assembly fluid conduit therewith.

19. The solar module collection assembly of claim 12, further including the step of capping said central vertically oriented support column at its top with a solar reflective surface or a wind turbine.

20. The solar module collection assembly of claim 12, further including the step of providing an array thereof.

* * * * *